United States Patent

Tsujikawa et al.

[19]

[11] Patent Number: 5,996,390
[45] Date of Patent: Dec. 7, 1999

[54] METHOD FOR MANUFACTURING VACUUM CHAMBER

[75] Inventors: Hiroshi Tsujikawa; Koji Shinobudani; Yosiki Ogata, all of Hiroshima; Takashi Iwamoto, Hokkaido; Shinichi Ono, Hokkaido; Hideo Iwasawa, Hokkaido, all of Japan

[73] Assignee: The Japan Steel Works, Ltd., Tokyo, Japan

[21] Appl. No.: 09/105,149

[22] Filed: Jun. 26, 1998

[51] Int. Cl.⁶ .............................. B21D 28/32; B21D 51/18
[52] U.S. Cl. .............................. 72/340; 72/335; 72/342.1; 72/358
[58] Field of Search ............................ 72/340, 341, 334, 72/335, 358, 359, 352, 342.1, 342.94

[56] References Cited

U.S. PATENT DOCUMENTS

| | | | |
|---|---|---|---|
| 1,598,240 | 8/1926 | Carlson | 72/340 |
| 1,699,688 | 1/1929 | Cross | 72/340 |
| 1,886,210 | 11/1932 | Mitchell | 72/352 |
| 2,063,386 | 12/1936 | Langford | 72/342.1 |
| 3,066,408 | 12/1962 | Fader | 72/341 |
| 4,662,047 | 5/1987 | Berchem | 72/334 |
| 4,709,569 | 12/1987 | Sabroff | 72/340 |

FOREIGN PATENT DOCUMENTS 78732  5/1984  Japan ..................................... 72/342.1

Primary Examiner—Daniel C. Crane
Attorney, Agent, or Firm—Sughrue, Mion, Zinn, Macpeak & Seas, PLLC

[57] ABSTRACT

In accordance with the present invention, the method of manufacturing a vacuum chamber which is used as a cluster tool, a vacuum film-forming apparatus, or the like of a manufacturing apparatus used for semiconductors, liquid crystals, solar cells, and the like, and which is formed by a vessel in which an opening (4A) is provided at one surface for forming a cover, and a hole (4) smaller than the opening (4A) is provided in an opposite surface to the opening (4A), includes the steps of:

by using a forging press which is provided with an outer die (3) and an inner die (2) for die forging a material (1-1), cutting the material to dimensions suitable for the die forging of the material (1-1) which is made of a metal;

heating the material (1-1) to a temperature for die forging;

placing the heated material (1-1) in the outer die (3) of the press, and pressing the inner die (2) against the material (1-1) by the forging press to effect forging; and subjecting the forged material to machining into a predetermined configuration.

15 Claims, 4 Drawing Sheets

METHOD FOR MANUFACTURING VACUUM CHAMBER

BACKGROUND OF THE INVENTION

1. Related Art

The present invention relates to a method of manufacturing a vacuum chamber which is used as a cluster tool, a vacuum film-forming apparatus, or the like of a manufacturing apparatus used for semiconductors, liquid crystals, solar cells, and the like, and which is used as an apparatus for manufacturing semiconductors, liquid crystals and the like, the pressure within the vacuum chamber being determined by its application and purpose in a range from a low vacuum close to the atmosphere to an ultra-high vacuum. More particularly, the present invention relates to novel improvements for manufacturing a vacuum chamber by forging.

2. Related Art

As the conventional methods of manufacturing a chamber of this type, a method in which a rolled plate-shaped material 10 to machining as it is, as well as a method in which the chamber is fabricated with a welded structure, are known.

With the conventional machining method, as shown in FIG. 6, since a fibrous structure 13 is formed along the rolling direction of the plate material 10, very small spaces exist in the direction of the fibers, and the very small spaces are liable to occur on machined surfaces facing the vacuum. Since the portion indicated at reference numeral 12 at the inner surface of a vacuum chamber 11 is a perpendicularly sectioned portion of the fibrous structure 13, and the very small spaces are deeply entrapped inside the material, the following problems are encountered.

In a case where the chamber is used as a vacuum chamber, the very small spaces result in an increase in the amount of gas released from the interior of the material and in lengthened release time.

Further, if water, contaminants, or the like has entered the very small spaces, they are difficult to be removed even under a vacuum condition, and the time until a required degree of vacuum is reached by the continuous discharging of air by a vacuum pump is appreciably delayed.

For this reason, the time until the processing of wafers or the like inside the chamber becomes possible is delayed (leads to a reduction in throughput). This constitutes a cause which deteriorates the performance of the vacuum chamber.

In addition, with the method in which the vacuum chamber is fabricated with a welded structure, very small cracks are liable to occur in the welds, and there occurs the phenomenon in which the gas fused in the beads during welding is emitted under vacuum for a long time, and adverse effects are often exerted on the performance of the vacuum chamber in the same way as described above. With the conventional machining method in which the rolled plate-shaped material is subjected to machining as it is, since a fibrous structure 13 is formed along the rolling direction of the plate material as shown in FIG. 6, very small spaces are exposed to the inner surfaces of the vacuum chamber as perpendicularly sectioned portions of the fibers, and the very small spaces are liable to be produced on the machined surfaces.

In an application to the vacuum chamber, as described above, these very small spaces cause an increase in the amount of gas released from the interior of the material, and water, contaminants and the like which entered the vary small spaces are difficult to be removed under a high vacuum, thereby exerting adverse effects to the performance of the vessel.

In addition, in recent years the apparatus tends to become larger in size.

For example, the diameters of silicon wafers processed by a semiconductor manufacturing apparatus are shifting from 8 inches (about 200 mm) to 12 inches (about 300 mm), and the manufacturing apparatus is becoming large correspondingly. For this reason, in cases where the chamber is fabricated by cutting out a plate material, the amount of material to be removed from the interior of the chamber is large, so that the manufacturing cost is tending to become high.

Furthermore, with the method in which the vacuum chamber is fabricated with the welded structure, very small cracks are liable to occur since the welds are even longer in conjunction with the need for the large-sized chamber, and adverse effects are often exerted on the performance of the vacuum chamber.

SUMMARY OF THE INVENTION

The present invention has been devised to overcome the above-described problems, and its object is to provide a method of manufacturing a vacuum chamber which, by manufacturing the vacuum chamber by forging, improves the gas releasability, is made lightweight, shortens the machining time, and makes a large-size configuration possible.

Accordingly, in accordance with the present invention there is provided a method of manufacturing a vacuum chamber which is used as a cluster tool, a vacuum film-forming apparatus, or the like of a manufacturing apparatus used for semiconductors, liquid crystals, solar cells, and the like, and which is formed by a vessel in which an opening (4A) is provided at one surface for forming a cover, and a hole (4) smaller than the opening (4A) is provided in an opposite surface to the opening (4A), comprising the steps of: by using a forging press which is provided with an outer die (3) and an inner die (2) for die forging a material (1-1), cutting the material to dimensions suitable for the die forging of the material (1-1) which is made of a metal and has a hole (4-4) formed by cutting an inner portion thereof; heating the material (1-1) to a temperature for die forging; placing the heated material (1-1) in the outer die (3) of the press, and pressing the inner die (2) against the material (1-1) by the forging press to effect forging; and subjecting the forged material to machining into a predetermined configuration. In this method, the vessel forms a vacuum conveying chamber arranged as a cluster tool in a liquid-crystal manufacturing apparatus. Further, in this method, the material of said vessel is aluminum.

DETAILED DESCRIPTION OF THE PREFERRED EMBODIMENTS

Referring now to the accompanying drawings, a description will be given of a method of manufacturing a vacuum chamber in accordance with the present invention.

Figure 1:
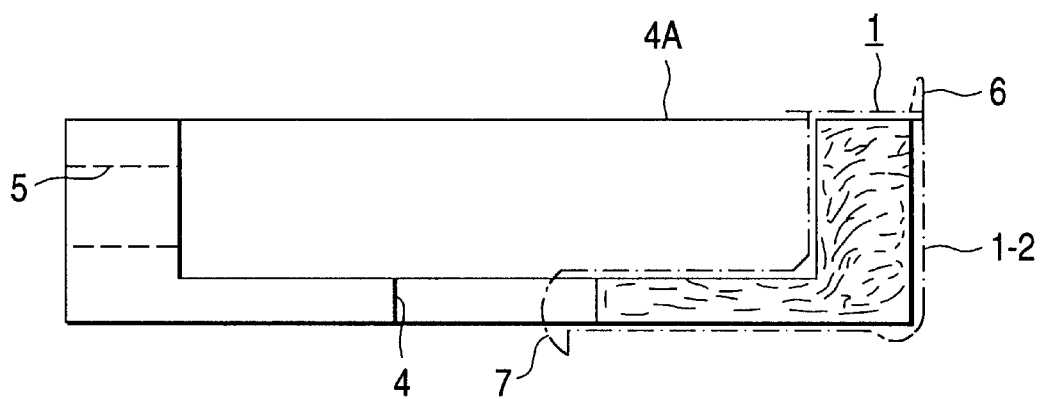
FIG. 1 is a cross-sectional view of a vacuum chamber after die forging in accordance with the present invention.
Figure 2:
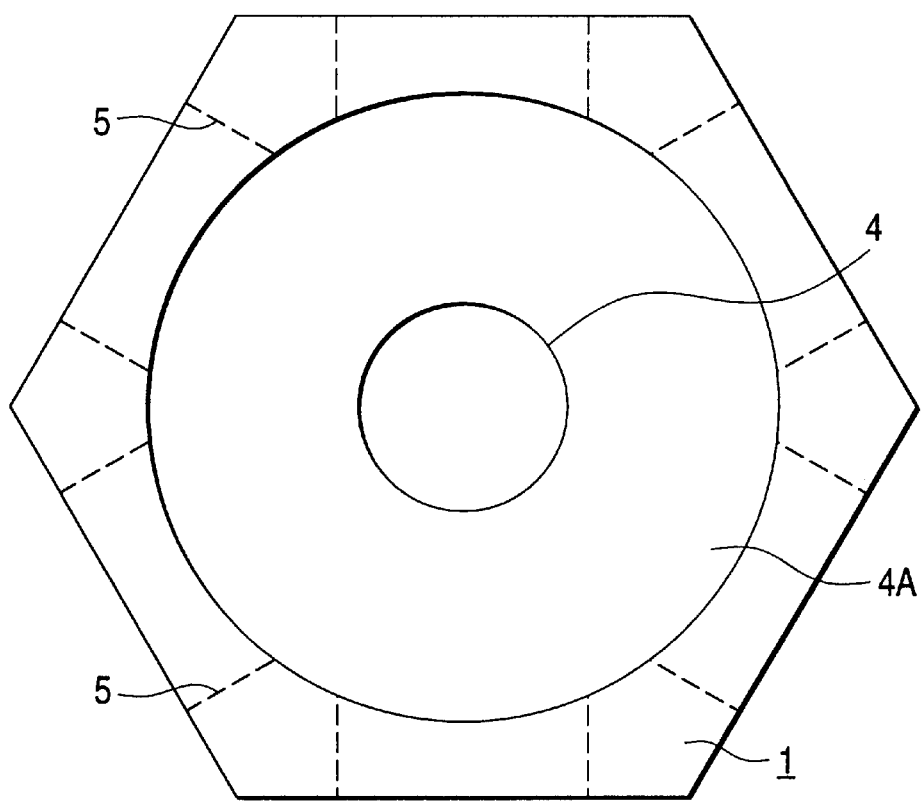
FIG. 2 is a plan view of the vacuum chamber shown in FIG. 1.
Figure 3:
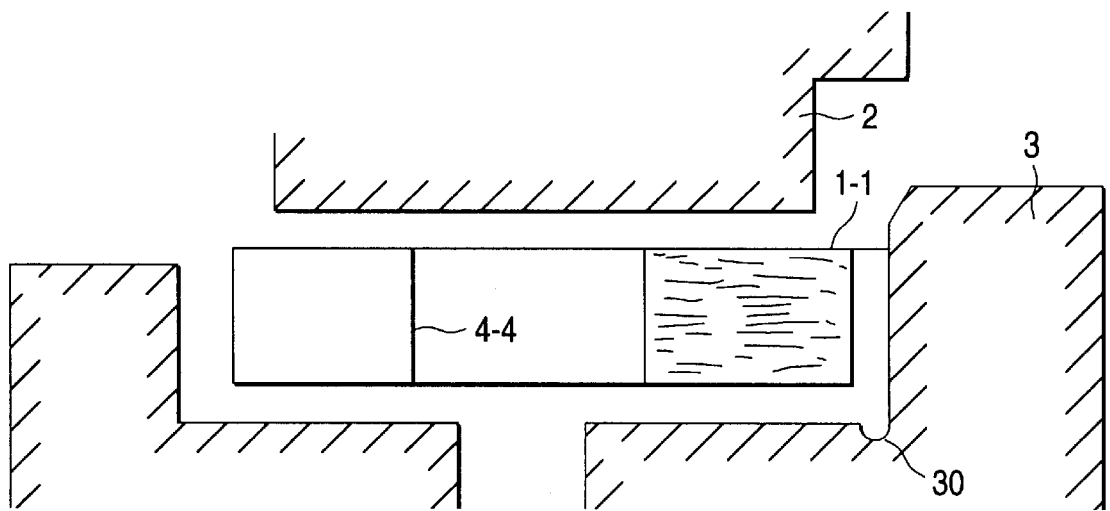
FIG. 3 is a cross-sectional view illustrating the state of material of the vacuum chamber to be die forged before the vacuum chamber shown in FIG. 1 is die forged.

FIGS. 1 and 2 are respectively a cross-sectional view and a plan view illustrating the vacuum chamber in accordance with the present invention; FIG. 3 is a schematic diagram illustrating a state of die forging of the vacuum chamber; and FIG. 4 is a perspective view of a cluster tool for a semiconductor devices in accordance with the prior art and the present invention.

Figure 4:
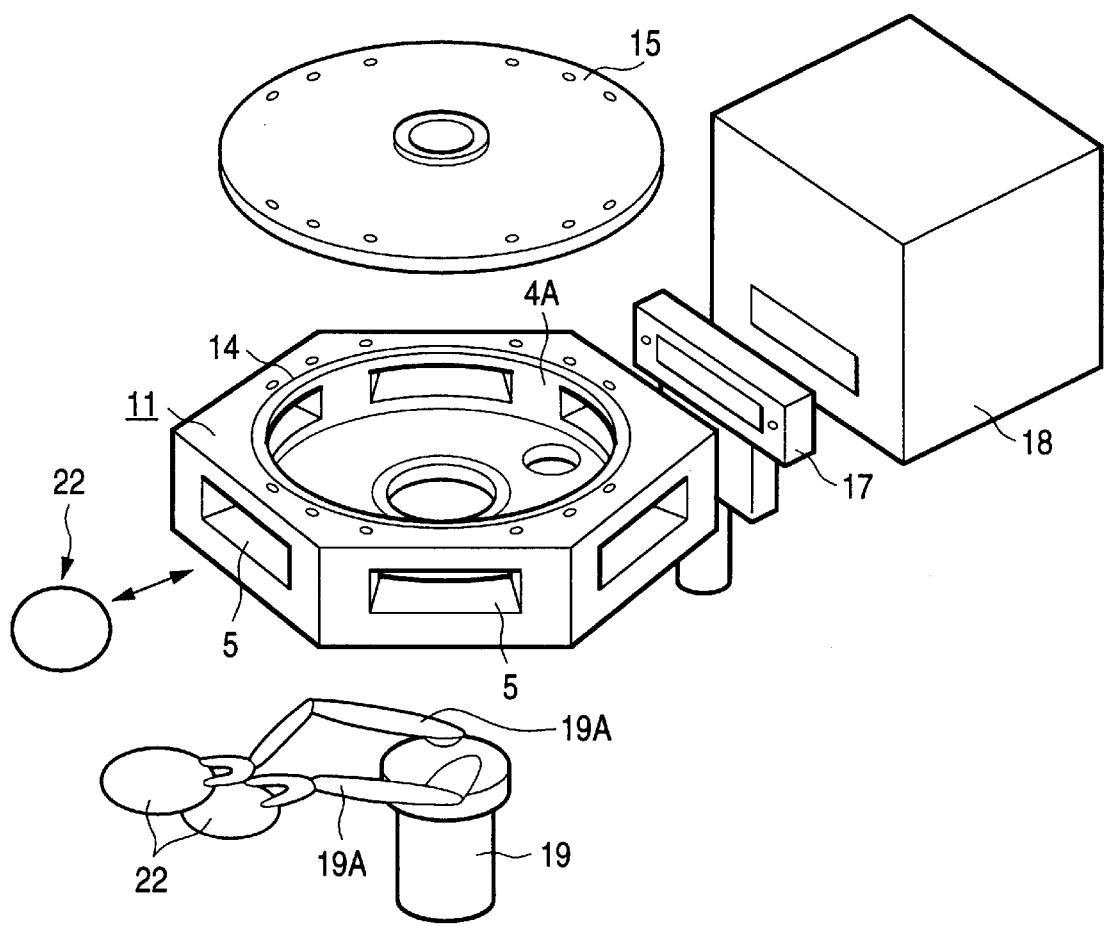
FIG. 4 is a is a schematic diagram of the vacuum chamber (cluster tool) in accordance with the present invention and the prior art.

In FIG. 4, a robot 19 for conveying silicon wafers 22 is installed inside a vacuum chamber 11 (a conveying chamber 1 in FIG. 1) for forming a vessel in accordance with the present invention. This vacuum chamber 11 has a hexagonal outer shape, and a process chamber 18 or a load-lock chamber can be installed on one of its sides, and these equipment are respectively disposed via a valve 17.

An upper portion of this vacuum chamber 11 is arranged such that a cover 15 is provided and an opening 4A which is vacuum sealed with a seal 14 is formed, the diameter of this vacuum chamber 11 being approximately 1 m.

FIGS. 1 to 3 show a method of manufacturing this vacuum chamber 1 (conveying chamber).

FIG. 1 is a cross-sectional view of the vacuum chamber 1 after die forging and illustrates a configuration after machining.

FIG. 2 is a plan view of FIG. 1 and illustrates the configuration after machining.

FIG. 3 is an explanatory diagram of die forging, and a forging press (not shown) which is provided with an outer die 3 and an inner die 2 for die forging a material 1-1 is used.

The material 1-1 of the vacuum chamber 1 or 11 is aluminum A5052, is cut to dimensions appropriate for die forging, is heated to about 450° C., and is placed in the outer die 3 shown in FIG. 3.

The material 1-1 is formed into a configuration in which excess thickness is provided to allow necessary portions to be machined after forging.

A hole 4-4 is provided in a central portion of the material 1-1 and is thereby formed into a configuration for preventing the pressure of the forging press from becoming excessively large.

According to an experiment, the pressing force of the press was lowered to $\frac{1}{1.5}$ in the same die forging as compared with a case where the hole 4-4 was not provided. The test data in this case will be illustrated below by way of example as a diagram on load-displacement curves for basic materials shown in FIG. 5.

This data is the result of conducting a test of die forging by using various configurations by fabricating $\frac{1}{20}$ models of real objects using the aluminum material JIS-A5052.

In terms of the configuration after forging, the models were small-sized hexagonal models shown in FIGS. 1 and 2, in which the length of an opposite side was 54 mm, and the height was 17 mm. The configuration of the basic material before forging is set to a hollow cylindrical shape having an outside diameter of 53.5 mm, an inside diameter of 25.0 mm, and a height of 17.4 mm. Additionally, two basic materials having inside diameters of 20 mm and 30 mm and a solid basic material without a hole with their outside diameters fixed to the same dimension were also tested for the sake of comparison, i.e., four kinds were tested in total. Further, the height of the basic material was varied so that the volume of the basic material becomes fixed. The condition of the heating temperature for the basic material was 480° C., and the condition of the die temperature was 450° C.

Figure 5:
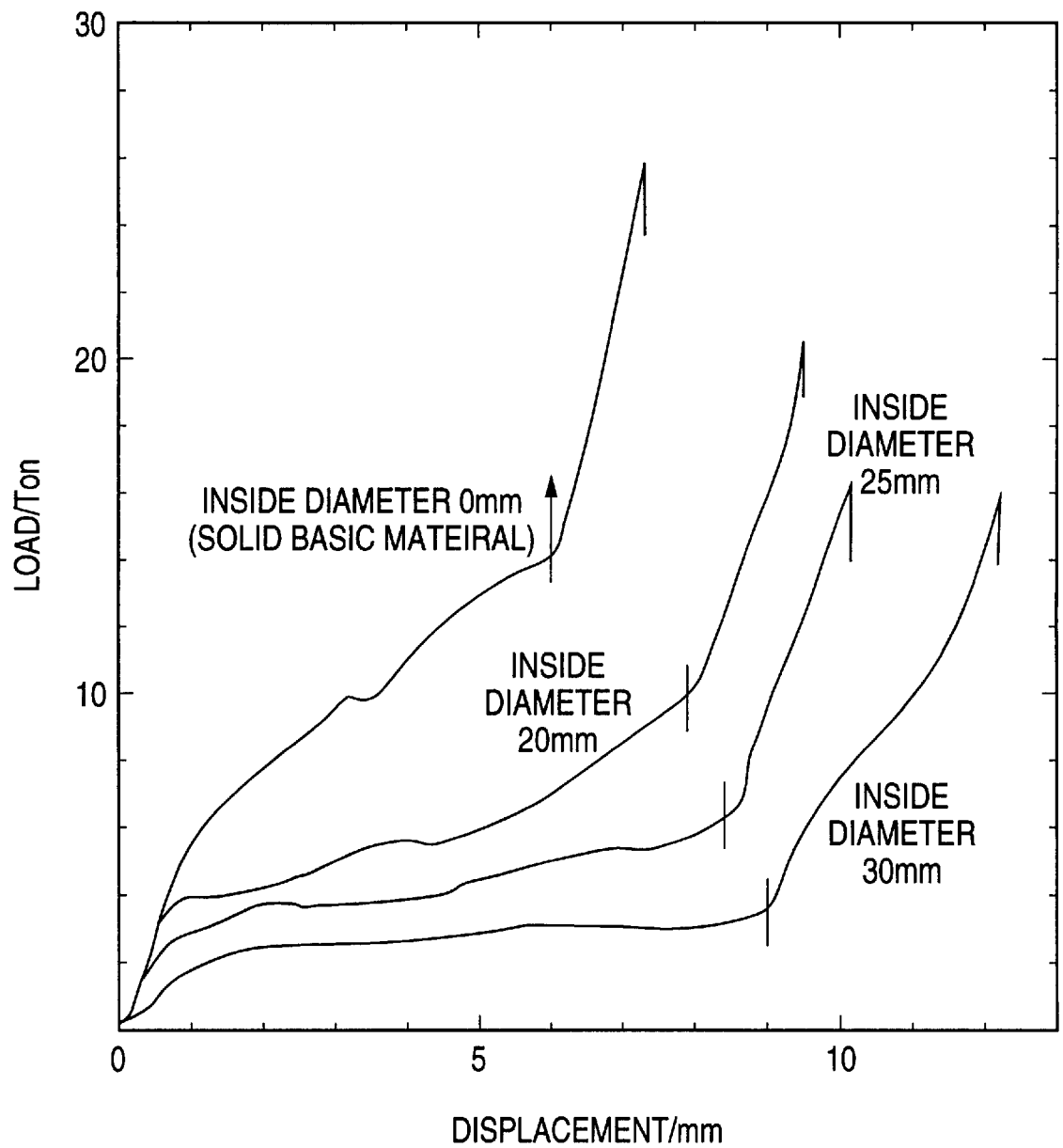
FIG. 5 is a diagram on load-displacement curves for basic materials, illustrating the results of a forging test of small-sized models.
Figure 6:
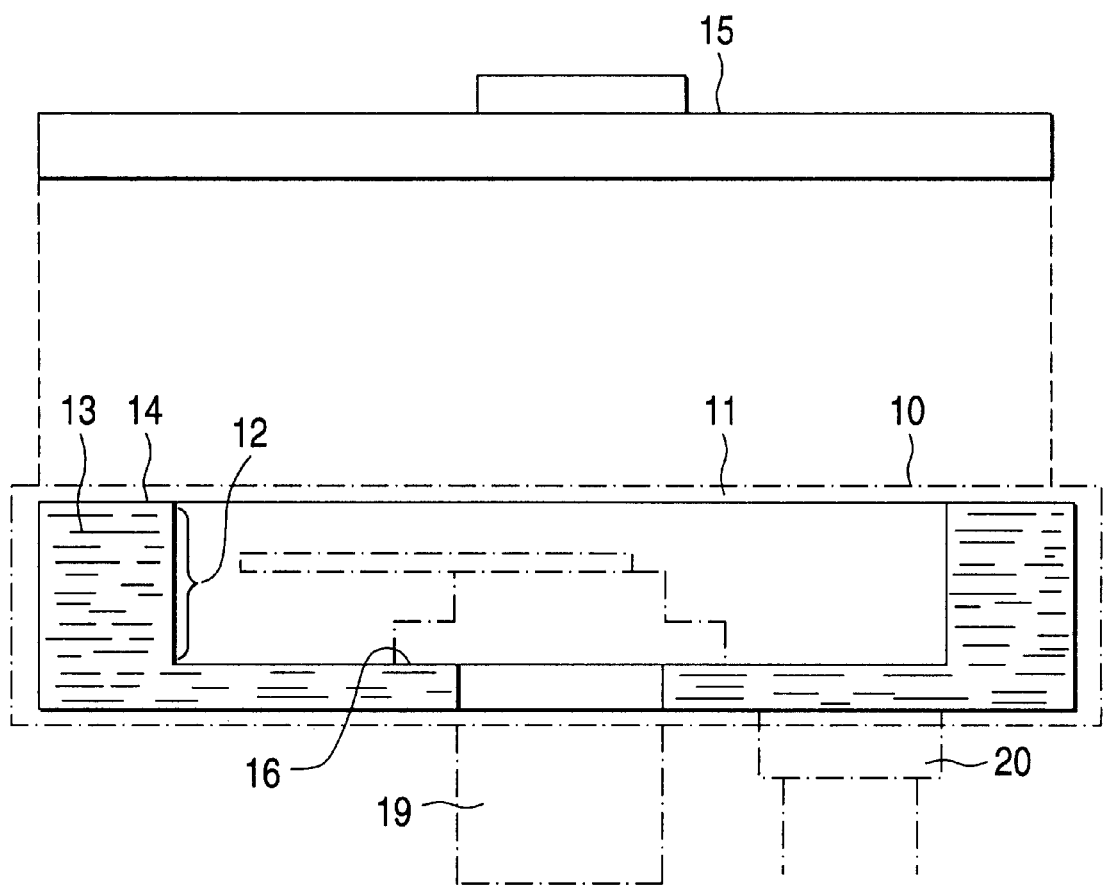
FIG. 6 is a cross-sectional view of a conventional vacuum chamber after completion.

As for the results, as shown in FIG. 5, substantial reductions of forging load were obtained for the hollow basic materials as compared with the solid basic material, and the required load was reduced to about $\frac{1}{1.5}$ even if surplus load for obtain a final configuration by pressing the material into corners of the dies is taken into consideration. This test was conducted by using small-sized models, the results show the same tendency even with actual objects.

The structure of the material after die forging becomes dense by virtue of the forging effect, the direction of fibers of the material runs in parallel along the configuration of the inner die 2 as shown in FIG. 1, and the inner surfaces of the chamber become free of a surface which separates the fibers perpendicularly thereto. FIGS. 1 and 2 show the configuration after machining upon forging, and the amount of machining can be reduced as compared with the prior art, and since less machining time is involved, the vacuum chamber can be manufactured in a short time. The configuration 1-2 indicated by the chain lines in FIG. 1 shows the configuration of the material prior to machining after die forging.

Burrs 6 are formed at an upper portion of the material 1-2.

In addition, excess metal 7 shown in FIG. 1 is formed in a central portion, and the configurations of the burrs 6 and excess metal 7 change depending on the individual volumetric error of the material 1-1. These burrs 6 and excess metal 7 are removed in post working.

The six holes 5 are cut out in machining upon forging. In forging, since material is difficult to flow to corners of the outer die, a recess 30 is provided, as necessary, in the outer die so as to facilitate the flow of the material.

A hole 4 is a hole through which the robot enters, and this hole 4 is formed to be smaller than the opening 4A on the opposite side to this hole 4. Holes 5 at lateral positions are openings through which the silicon wafers 22 of a semiconductor are conveyed by a pair of robot arms 19A, and the holes 5 are formed by machining after forging.

In this example, the vacuum chambers 1 and 11 have a diameter of about 1 m, but as compared with the conventional method of fabricating the vacuum chamber 1 or 11 by cutting with a machine, the weight of the material of the vacuum chamber 1 or 11 is reduced by about half, which is very economical.

As another application, the present invention may be applied as a method of manufacturing a load-lock chamber, a process chamber, and the like in addition to the conveying chamber in accordance with this embodiment.

In this method, after machining, the inner surfaces of the chamber may be provided with surface treatment such as plating and oxide film formation, and measures may be adopted to further clean the inner surfaces of the chamber and prevent release of gas, thereby to improve the reliability.

Although commonly used aluminum has been illustrated by way of example as the material, the material may be another type of material or an alloy.

The method of manufacturing a vacuum chamber in accordance with the present invention is arranged as described above, it is possible to obtain the following advantages. Namely, by die forging the vacuum chamber, the structure of the material becomes dense by virtue of the forging effect, and the direction of fibers of the material runs in parallel along the configuration of the inner die 2, and the inner surfaces of the chamber become free of a surface which separates the fibers perpendicularly thereto, with the result that the gas releasability of the material improves.

In addition, the weight of the material is reduced, which is economical.

In addition, the amount of material to be removed in machining after forging is reduced as compared with the prior art, and since less machining time is involved, the vacuum chamber can be manufactured in a short time.

In addition, since the hole 4-4 is provided in the central portion of the material prior to forging for the cluster tool, the pressing force of the press is lowered to about $1/1.5$ in the same die forging.

In addition, an even larger vacuum chamber can be die formed with the same pressing force of the press.

Furthermore, by adopting die forging, the vessels can be mass produced, thereby making it possible to reduce the manufacturing cost.

What is claimed is:

1. A method of manufacturing a vacuum chamber comprising the steps of:

providing a forging press which is provided with an outer die and an inner die for die forging a material;

cutting a metal material to dimensions suitable for die forging and so as to have a hole through an inner portion thereof;

heating the material to a temperature for die forging;

placing the heated material in the outer die of the press, and pressing the inner die against the material by the forging press to effect forging; and subjecting the forged material to machining into a vacuum chamber having a predetermined configuration.

2. The method of manufacturing a vacuum chamber according to claim 1, wherein said vessel forms a vacuum conveying chamber arranged as a cluster tool in a liquid-crystal manufacturing apparatus.

3. The method of manufacturing a vacuum chamber according to claim 1, wherein the material of said vessel is aluminum.

4. The method of manufacturing a vacuum chamber according to claim 2, wherein the material of said vessel is aluminum.

5. The method of manufacturing a vacuum chamber according to claim 1, wherein said outer die includes a cavity and said step of placing the heated material in the outer die includes placing the heated material within the cavity.

6. The method of manufacturing a vacuum chamber according to claim 5, wherein said inner die includes a portion which is smaller than said cavity in said outer die such that said step of pressing the inner die against the material by the forging press forms an opening on one surface of the material.

7. The method of manufacturing a vacuum chamber according to claim 6, wherein said step of pressing the inner die against the material is stopped before said portion of said inner die reaches the bottom of said cavity in said outer die such that after said step of pressing, said hole on the inner portion of the material is on an opposite surface of said material as said opening.

8. The method of manufacturing a vacuum chamber according to claim 7, wherein said step of subjecting the forged material to machining includes cutting at least one lateral opening between said opposite surfaces thereof.

9. The method of manufacturing a vacuum chamber according to claim 8, wherein said step of cutting at least one lateral opening includes cutting said at least one lateral opening so that it extends through said material in a direction perpendicular to a longitudinal axis of said hole.

10. The method of manufacturing a vacuum chamber according to claim 5, wherein said cavity includes a recess in a bottom thereof such that during said step of pressing the inner die against the material causes some of said material to enter said recess.

11. The method of manufacturing a vacuum chamber according to claim 10, wherein said step of subjecting the forged material to machining includes removing the portion of said material which enters said recess.

12. The method of manufacturing a vacuum chamber according to claim 1, wherein said step of subjecting the forged material to machining includes removing burs.

13. The method of manufacturing a vacuum chamber according to claim 1, wherein said step of subjecting the forged material to machining includes removing excess metal from said hole.

14. The method of manufacturing a vacuum chamber according to claim 1, wherein said step of pressing the inner die against the material by the forging press includes moving said inner die and said outer die relative to one another in a first direction.

15. The method of manufacturing a vacuum chamber according to claim 14, wherein said step of placing the heated material in the outer die includes placing the heated material so that the hole on the inner portion thereof has its central longitudinal axis extending in said first direction.

* * * * *

UNITED STATES PATENT AND TRADEMARK OFFICE
CERTIFICATE OF CORRECTION

PATENT NO. : 5,996,390
DATED : December 7, 1999
INVENTOR(S) : Hiroshi Tsujikawa, Koji Oshitani, Yosiki Ogata,
Takashi Iwamoto, Shinichi Ono, Hideo Iwasawa It is certified that error appears in the above-indentified patent and that said Letters Patent is hereby corrected as shown below:

In section [30] entitled "Foreign Application Priority Data" the following two Japanese Applications should be listed:

June 26, 1997 [JP] Japanese Hei. 9-170532
May 21, 1998 [JP] Japanese Hei. 10-140117

Signed and Sealed this

Tenth Day of April, 2001

*Attest:*

NICHOLAS P. GODICI

*Attesting Officer*  *Acting Director of the United States Patent and Trademark Office*